United States Patent
Peattie et al.

(10) Patent No.: US 10,627,444 B1
(45) Date of Patent: Apr. 21, 2020

(54) MODULAR AND STACKABLE INTEGRATED LOGIC ANALYZER

(71) Applicant: Xilinx, Inc., San Jose, CA (US)

(72) Inventors: Michael E. Peattie, Campbell, CA (US); Bradley K. Fross, Boulder, CO (US)

(73) Assignee: XILINX, INC., San Jose, CA (US)

( * ) Notice: Subject to any disclaimer, the term of this patent is extended or adjusted under 35 U.S.C. 154(b) by 134 days.

(21) Appl. No.: 15/807,496

(22) Filed: Nov. 8, 2017

(51) Int. Cl.
*G01R 31/28* (2006.01)
*G01R 31/317* (2006.01)
*G01R 31/3177* (2006.01)

(52) U.S. Cl.
CPC ... *G01R 31/31703* (2013.01); *G01R 31/3177* (2013.01)

(58) Field of Classification Search
CPC .......... G01R 31/3177; G01R 31/31704; G01R 31/31705; G01R 31/31703; G06F 17/5022; G06F 11/3636; G06F 11/349; G06F 11/3476; G06F 11/3495; G06F 11/364; G06F 2201/88; G06F 11/2236
See application file for complete search history.

(56) References Cited

U.S. PATENT DOCUMENTS

| | | | |
|---|---|---|---|
| 6,384,627 B1 | 5/2002 | Fross et al. | |
| 6,633,838 B1* | 10/2003 | Arimilli | G06F 11/2236 703/16 |
| 6,760,898 B1 | 7/2004 | Sanchez et al. | |
| 7,353,474 B1 | 4/2008 | Donlin | |
| 7,752,016 B2* | 7/2010 | Johnson | G06F 11/349 702/186 |
| 8,020,127 B1 | 9/2011 | Chan et al. | |
| 8,099,271 B2* | 1/2012 | Schubert | G01R 31/31704 703/16 |
| 8,214,694 B1 | 7/2012 | McKechnie et al. | |
| 8,332,697 B1* | 12/2012 | Peattie | G01R 31/3177 714/724 |
| 8,533,655 B1 | 9/2013 | Konduru | |
| 9,222,976 B1* | 12/2015 | Usgaonkar | G01R 31/3177 |
| 2002/0078264 A1* | 6/2002 | Eberhard | G06F 11/349 710/1 |

(Continued)

OTHER PUBLICATIONS

Zeroplus user's manual V1.04.04 (Year: 2017).*
U.S. Appl. No. 15/091,376, filed Apr. 5, 2016, Nand, Heera et al., Xilinx, Inc., San Jose, CA USA.

*Primary Examiner* — Guerrier Merant
(74) *Attorney, Agent, or Firm* — Cuenot, Forsythe & Kim, L.L.C.

(57) ABSTRACT

An integrated circuit having an integrated logic analyzer can include a match circuit including at least one match cell, wherein each match cell is programmable at runtime to detect a signal state from a plurality of signal states for a probed signal. The integrated circuit can include a combine circuit configured to generate a first match signal indicating an occurrence of a first trigger condition based upon the detected signal state of each match cell, a capture and control circuit configured to determining addressing for storing trace data corresponding to the probed signal, and a trace storage memory configured to the store trace data at addresses determined by the capture and control circuit.

17 Claims, 5 Drawing Sheets

(56) References Cited

U.S. PATENT DOCUMENTS

2008/0126877 A1* 5/2008 Alsup ................ G06F 11/3636
714/45
2010/0332909 A1* 12/2010 Larson ............... G06F 11/3476
714/40

* cited by examiner

MODULAR AND STACKABLE INTEGRATED LOGIC ANALYZER

TECHNICAL FIELD

This disclosure relates to integrated circuits (ICs) and, more particularly, to a logic analyzer integrated within an IC.

BACKGROUND

A logic analyzer is an electronic device that is capable of capturing and displaying signals of a digital system or digital circuit for purposes of debugging and/or verification. In the case of some programmable integrated circuits (ICs), the logic analyzer is included within the IC itself. The logic analyzer and a user circuit design, for example, are implemented within the IC using programmable circuitry. The logic analyzer is referred to as an "integrated logic analyzer" (ILA) since the logic analyzer is integrated with the user circuit design and implemented in the same IC as the user circuit design for purposes of debugging and/or verification.

To utilize an ILA, an ILA core is inserted into the user circuit design. Probe points within the user circuit design are specified by the user using an electronic design automation tool. The user circuit design is implemented with the probe points being routed to the ILA core. As such, signals of interest within the programmable IC, e.g., the probe points, are captured and stored by the ILA core for subsequent analysis.

Typically, the ILA core is implemented as a single, large, and complex circuit block where probed signals from throughout the user's circuit design are routed to this single ILA core. Implementation of the ILA core often requires a significant amount of circuit resources of the target IC. The size and complexity of the ILA core makes integrating the ILA core with a user circuit design difficult. In some cases, fitting the ILA core on the same IC as the user circuit design can be challenging. The ILA core and the user circuit design may not fit on the same IC. If successfully included in the user circuit design, the resulting quality of result from performing synthesis, placement, and routing may be reduced due to the size and complexity of the ILA core. In some cases, the ILA core itself becomes the source of timing critical signal paths, which has the undesirable effect of reducing the operating frequency of the user design.

SUMMARY

One or more embodiments are directed to an integrated circuit (IC) that includes an integrated logic analyzer (ILA). In an aspect, the ILA includes a match circuit having at least one match cell, wherein each match cell is programmable at runtime to detect a signal state from a plurality of signal states for a probed signal, and a combine circuit configured to generate a first match signal indicating an occurrence of a first trigger condition based upon the detected signal state of each match cell. The ILA further can include a capture and control circuit configured to determine addressing for storing trace data corresponding to the probed signal and a trace storage memory configured to store the trace data at addresses determined by the capture and control circuit.

One or more embodiments are directed methods for implementing an ILA within an IC. In an aspect, the method includes providing a match circuit including at least one match cell, wherein each match cell is programmable at runtime to detect a signal state from a plurality of signal states for a probed signal, and providing a combine circuit configured to generate a first match signal indicating an occurrence of a first trigger condition based upon the detected signal state of each match cell. The method can include providing a capture and control circuit configured to determine addressing for storing trace data corresponding to the probed signal and providing a trace storage memory configured to store the trace data at addresses determined by the capture and control circuit.

One or more embodiments are directed methods for probing signals within an IC. In an aspect, the method includes providing a first ILA and a second ILA within an IC and coupling the first ILA to the second ILA. The method can include coordinating operation of the second ILA with the first ILA based upon an operating condition detected within the first ILA.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION OF THE DRAWINGS

Figure 1A:
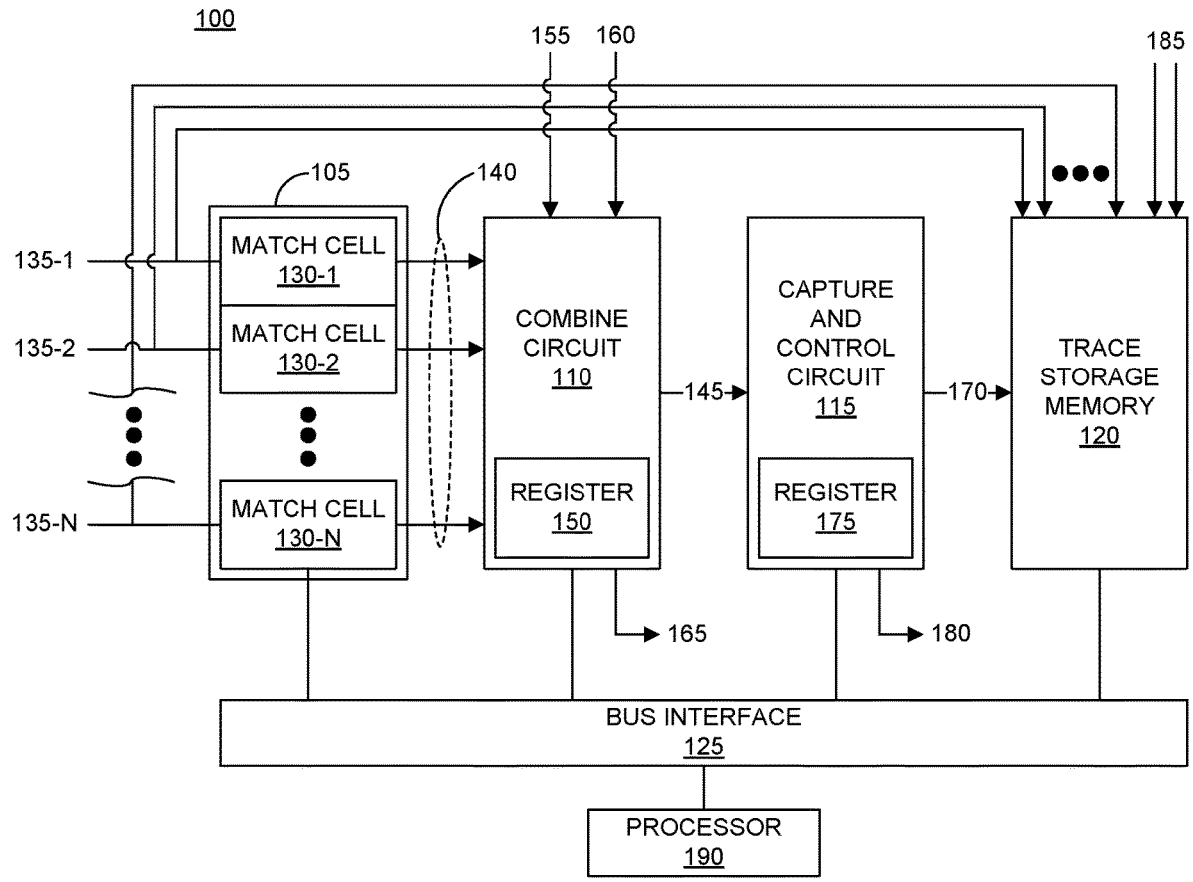
FIG. 1A illustrates an example of an integrated logic analyzer (ILA).

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to a logic analyzer that is integrated within an IC. In accordance with the inventive arrangements described within this disclosure, an integrated logic analyzer (ILA) is provided. The ILA is capable of performing a variety of different logic analyzer functions relating to the capture of probed signals of a user circuit design. In one or more embodiments, the ILA circuit architecture uses fewer circuit resources of the target IC than is the case with other conventional ILAs. In particular embodiments, the ILA is capable of operating at higher frequencies than is the case with other conventional ILAs.

In one or more embodiments, the ILA is modular and/or stackable. Within a single target IC, more than one ILA can be included and used to monitor probed signals of a user circuit design. The ILAs are modular in that the ILAs can be distributed throughout the target IC. In some embodiments, the multiple ILAs are capable of operating independently of one another. In particular embodiments, the ILAs are capable of being coupled together within the target IC. As such, the ILAs are capable of communicating with one another and operating in coordination with one another. For example, two or more ILAs can be combined with other circuit blocks of a user circuit design into a matrix and/or a stacked configuration that maintains the advantages of the smaller ILA circuit architecture (e.g., fewer resources used and faster operation) while also providing features typically available only with a conventional ILA that is implemented as a single, monolithic circuit block.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1A illustrates an example of an ILA 100. In the example of FIG. 1A, ILA 100 includes a match circuit 105, a combine circuit 110, a capture and control (CC) circuit 115, and a trace storage memory 120. The different circuit blocks of ILA 100 are configurable, e.g., programmable, at runtime using bus interface 125. As illustrated, each of match circuit 105, combine circuit 110, CC circuit 115, and trace storage memory 120 is coupled to bus interface 125. A host is capable of configuring or programming each of match circuit 105, combine circuit 110, and CC circuit 115 during operation of ILA 100 within an IC. The host is also capable of reading or otherwise accessing trace storage memory 120 via bus interface 125.

In one or more embodiments, processor 190 is operable as a host that is capable of writing configuration data to match circuit 105, combine circuit 110, and/or CC circuit 115 via bus interface 125 to program each respective circuit block after ILA 100 is instantiated or implemented in circuitry of an IC. Processor 190 is further capable of reading and/or writing trace storage memory 120 via bus interface 125. In one or more embodiments, processor 190 is embedded in the same IC in which ILA 100 is implemented. In one or more other embodiments, processor 190 is part of another system or IC, e.g., is external to the IC in which ILA 100 is implemented.

Examples of bus interface 125 include an on-chip interconnect such as an AMBA eXtensible Interface (AXI) bus. An AMBA AXI bus is an embedded microcontroller bus interface for use in establishing on-chip connections between circuit blocks and/or systems. Other example implementations of a bus interface include, but are not limited to, other available bus architectures, cross-bars, and networks on chip (NoCs).

Match circuit 105 includes one or more match cells 130 shown as 130-1, 130-2, through 130-N. The particular number of match cells 130 included in match circuit 105 can be a user specified number based upon the size of the signal or signals to be probed. In some cases, match circuit 105 includes a single match cell 130-1. In other cases, match circuit 105 includes two or more match cells, e.g., match cells 130-1, 130-2, up to 130-N.

In particular embodiments, each of match cells 130 is capable of receiving a probed signal 135. Probed signals 135 are signals routed to ILA 100 from probe points specified in the user's circuit design. In particular, probed signals are signals routed to match circuit 105. Each match cell 130 is capable of detecting a predetermined state on the received probed signal 135. The particular state that each match cell 130 detects is selected from a plurality of predetermined signal states. In response to detecting the particular signal state for which a given match cell 130 is programmed to detect, that match cell outputs an indication signal 140, e.g., pulls signal 140 high or low. Indication signals 140 are provided to combine circuit 110.

In one or more embodiments, probed signals 135 can be defined at various points in the user's design cycle including, but not limited to, design entry, post synthesis and linking, or post place and/or route. Further aspects of defining signals for debugging are described below in connection with pre-instantiation.

Each of match cells 130-1 through 130-N can be individually programmed to detect a particular one of the signal states independently of the other ones of match cells 130-1 through 130-N. As an example, match cell 130-1 is capable of detecting a first signal state while match cell 130-2 is capable of detecting a second and different signal state, while match cell 130-N is capable of detecting a third and different signal state. A host, for example, is capable of writing to match cells 130 via bus interface 125. The host is capable of writing to any one of match cells 130, any combination of two or more of match cells 130, or to all of match cells 130 to program or instruct each such match cell 130 as to the particular signal state the match cell 130 is to detect.

In one or more embodiments, each match cell 130 is capable of operating on a 1-bit signal. For example, each of probed signals 135-1 through 135-N may be a 1-bit signal. Probed signals 135-1 through 135-N may be part of a larger, multibit signal.

Table 1 illustrates example signal states that can be detected by each of match cells 130. The first column entitled "Match Expression" indicates the value that is written to the match cell 130 by the host in order to program or configure that match cell 130 to detect the signal state described in the second column entitled "Signal State." Each match cell 130, for example, may include a control register (not shown) that may be written by the host with a match expression. The match cell is operative to detect the particular signal state specified by the match expression stored in the control register. In response to detecting the programmed signal state, each match cell 130 outputs a corresponding indication signal 140 (e.g., a 1-bit signal that is pulled low or pulled high) to indicate the detection of the signal state.

TABLE 1

| Match Expression | Signal State |
| --- | --- |
| 3'h0 | Detects a Binary 0 |
| 3'h1 | Detects a Binary 1 |
| 3'h2 | Detects a Rising Edge (Detects a 0 followed by a 1) |
| 3'h3 | Detects a Falling Edge (Detects a 1 followed by a 0) |
| 3'h4 | Detects Either Edge (Detects a rising or a falling edge) |
| 3'h5 | Detects No Edges (Detects either a 1 or 0 with no transition on the previous cycle) |
| 3'h6 or 3'h7 | Don't Care (Always outputs a 1 regardless of the state of the probed signal) |

In one or more embodiments, each match cell 130 is implemented using one or more lookup tables within configurable logic blocks of the IC. The probed signal can be provided to a first input of the lookup table (match cell) with a delayed version of the probed signal provided to a second input of the lookup table. An example implementation of a match cell 130 described in greater detail in connection with FIG. 1B. Listing 1 illustrates example hardware description language code that, when synthesized and implemented within an integrated circuit, implements an instance of a match cell 130 therein.

Listing 1

```
module mu_1 bit(
input clk_i,
input data_i,
input [2:0] trig_i,
output reg match_o
);
reg data_dly;
always @(posedge clk_i)
    data_dly<=data_i;
always @(*)
case (trig_i)
//==0
3'h0: match_o<=data_i==1'b0 ? 1'b1:1'b0;
//==1
3'h1: match_o<=data_i==1'b1 ? 1'b1:1'b0;
//==R
3'h2: match_o<=data_i==1'b1 && data_dly==1'b0 ? 1'b1:1'b0;
//==F
3'h3: match_o<=data_i==1'b0 && data_dly==1'b1 ? 1'b1:1'b0;
//==B
3'h4: match_o<=data_i !=data_dly ? 1'b1:1'b0;
//==N
3'h5: match_o<=data_i==data_dly ? 1'b1:1'b0;
//==X
default: match_o<=1'b1;
endcase
endmodule
```

Combine circuit 110 is coupled to match cells 130 by way of indication signals 140. Combine circuit 110 is capable of applying a function to each of indication signals 140. Combine circuit 110 is capable of generating a match signal 145 specifying a result of applying the function to indication signals 140. Match signal 145 indicates whether a trigger condition is detected within ILA 100. For example, match signal 145 may be pulled high (low) to specify the result from applying the function to indication signals 140. In an example, the function applied by combine circuit 110 to indication signals 140 may be a logical OR. In another example, the function applied by combine circuit 110 to indication signals 140 may be a logical AND.

In particular embodiments, register 150 is included in combine circuit 110. Register 150 is capable of storing control data that specifies the particular function that is to be applied to indication signals 140 by combine circuit 110. For example, register 150 is capable of specifying a value that indicates whether to apply a logical OR to indication signals 140 or a logical AND to indication signals 140. In one or more other embodiments, combine circuit 110 is capable of applying a more complex function to indication signals 140. In that case, register 150 is capable of storing control data specifying the function to be applied to indication signals 140. Register 150 can be written during runtime by processor 190. As such, the particular function applied to indication signals 140 may be changed during operation of the IC without loading a new and/or different configuration bitstream. In one or more embodiments, combine circuit 110 may be implemented using one or more lookup tables as described in connection with match cells 135.

In one or more embodiments, combine circuit 110 receives a match signal 155 from another ILA. For example, one or more instances of ILA 100 may be implemented within the same IC. Match signal 155 may be similar to match signal 145, albeit generated and output from a combine circuit located in a different ILA than ILA 100. Match signal 155 indicates whether the other ILA has detected a trigger condition.

In one or more embodiments, combine circuit 110 receives a done signal 160 from another ILA. For example, one or more instances of ILA 100 may be implemented within the same IC. Done signal 160, which is described in greater detail below in connection with CC circuit 115, indicates whether the other ILA from which done signal 160 originates has encountered a memory full condition.

Combine circuit 110 is capable of incorporating match signal 155 and/or done signal 160 into the determination of whether a trigger condition is detected in ILA 100. For example, combine circuit 110 is capable of applying the function described not only to indication signals 140, but to any combination of indication signals 140, match signal 155, and/or done signal 160. Further, while one match signal 155 and one done signal 160 is described as being received from another ILA, it should be appreciated that two or more match signals 155 from two or more ILAs and/or two or more done signals from two or more ILAs can be received. The function applied by combine circuit 110 can be applied to any combination of indication signal(s) 140, match signal (s) 155, and/or done signal(s) 160.

In particular embodiments, the control data stored in register 150 indicates which combination of signals to include in the function. Those signals that are excluded from consideration in the function, for example, may be treated as "don't care" signals. Accordingly, a trigger condition may be detected based upon only one or more done signals 160, or only one or more match signals 155, or only one or more of indication signals 140, or any combination thereof.

The result of application of the function is provided as match signal 145 and indicates whether a trigger condition is detected in ILA 100. As such, the trigger condition can be dependent upon any combination of indication signals 140, on one or more match signal 155 from one or more other ILAs, and/or on one or more done signal 160 from one or more other ILAs.

In one or more embodiments, match signal 155 and done signal 160 may be generated by the same ILA. In one or more other embodiments, match signal 155 may be generated by a first ILA that is different from ILA 100, while done signal 160 is generated by a second ILA that is different from ILA 100 and the first ILA. As such, combine circuit 110 need not receive both match signal 155 and done signal 160 from a same ILA.

In the example of FIG. 1A, combine circuit 110 is capable of generating a signal 165. In one or more embodiments, signal 165 is a duplicate of match signal 145. Signal 165 can be provided to another ILA implemented elsewhere on the same IC. Signal 165, for example, can be provided to another ILA and utilized by the combine circuit in such other ILA for purposes of coordinating operation of the other ILA or other ILA(s) with ILA 100.

Combine circuit 110 is also capable of providing or exposing the result from the function to bus interface 125. As an illustrative and non-limiting example, combine circuit 110 is capable of providing the result of the function as a carry out signal. By providing the result to bus interface 125, the host (e.g., processor 190) or another circuit is able to access and read the result generated by combine circuit 110 if coupled to bus interface 125.

CC circuit 115 is capable of receiving match signal 145. In response to a trigger condition indicated by match signal 145, CC circuit 115 is capable of generating the proper addressing for trace storage memory 120. CC circuit 115 is capable of generating addressing, e.g., write addresses, for storing trace data within trace storage memory 120 based, in part, upon the number of windows being used.

The term "window" refers to a portion or address space of trace storage memory 120 that is dedicated to storing trace data for a particular trigger condition or a particular occurrence of a trigger condition. Each window is some fraction of the total size of trace storage memory 120. Trace storage memory 120, for example, may be subdivided into two or more windows where each window is capable of storing trace data for a different trigger condition. As an illustrative and non-limiting example, for a trigger condition, trace storage memory 120 is capable of storing the values of probed signals prior to the occurrence of the trigger condition, after the occurrence of the trigger condition, or both prior to and after the occurrence of the trigger condition. The trace data stored for that trigger condition is stored within a "window" of trace storage memory 120.

In one or more embodiments, the size of each window implemented by ILA 100 is constrained to be a power of 2. The window may be sized to any power of 2 up to the size of trace storage memory 120. In particular embodiments, when more than one window is used, the trigger condition must be located at the beginning of the window. These constraints allow for a less complex ILA circuit architecture and CC circuit 115. As a result, ILA 100 is able to operate at faster clock speeds and requires fewer resources of the target IC. In particular embodiments, the ILA circuit architecture described in connection with FIG. 1A is capable of operating at clock speeds exceeding 500 MHz with a programmable IC such as a field programmable gate array (FPGA).

In the example of FIG. 1A, CC circuit 115 is coupled to trace storage memory 120 via signal 170. Signal 170 may be a multibit signal. In particular embodiments, signal 170 includes an address signal provided from CC circuit 115 to trace storage memory 120 indicating addresses in trace storage memory 120 where values of probed signals (e.g., 135-1 through 135-N) are stored as trace data. In addition, signal 170 may include a write enable signal provided from CC circuit 115 to trace storage memory 120 to enable writing operations thereto.

It should be appreciated that in one or more embodiments, ILA 100 is continually storing trace data. For example, CC circuit 115 is capable of providing addresses that that overwrite portions of trace data in a window that are stored but not considered part of the window, e.g., where trace data was stored in anticipation of a detected trigger condition, but the trigger condition is not yet detected thereby necessitating overwriting of the older trace data so that trace data is stored with the trigger condition being located within the trace data at the enumerated or specified location.

As defined within this disclosure, the term "trace data" refers to any data that is stored within trace storage memory 120. In one or more embodiments, trace data includes the values of probed signals provided or routed to match circuit 105. In the example of FIG. 1A, probed signals 135 are provided to trace storage memory 120. The probed signals 135 may be data signals, control signals, or a combination of both. As such, the values stored as trace data within trace storage memory 120 may include any combination of data values and control signal values.

In particular embodiments, one or more additional signals 185 may be provided to trace storage memory 120 that are not provided to match circuit 105. Values of signals 185, for example, may be stored within trace storage memory 120 as trace data with probed signals 135 despite signals 185 not being probed signals that are provided to, and processed by, match circuit 105. Signals 185, however, still may be stored at addresses determined by CC circuit 115 and stored under control of CC circuit 115, e.g., when CC circuit 115 write enables trace storage memory 120, as trace data corresponding to, or for, the probed signal(s). For purposes of discussion, probed signals 135 and signals 185 may be referred to as debug signals.

As an illustrative and non-limiting example, control and status signals of an interface may be probed and provided to match circuit 105 as probed signals 135. The control and status signals may be for an AXI interface or another type of suitable interface. ILA 100 is capable of monitoring probed signals 135 to determine whether a trigger condition has occurred. In response to detecting a trigger condition, CC circuit 115 is capable of write enabling trace storage memory 120 and providing addresses for writing data via signal 170 to trace storage memory 120.

Accordingly, trace storage memory 120, in response to signal 170, is capable of storing the values of signal(s) 185. Signal(s) 185, for example, may be address and data signals from the interface, which are different signals than those of the interface actually probed and used to determine whether a trigger condition has occurred. In this example, ILA 100 utilizes probed signals 135 to determine whether a trigger condition (e.g., a transaction in this example) has occurred, but stores other data in response to the detected trigger condition. In this example, signals 135 need not be provided or routed to trace storage memory 120. In the alternative, signals 135 may be provided to trace storage memory 120, with trace storage memory 120 being capable of storing only selected signals, e.g., a subset of the signals, provided thereto as trace data. Thus, depending upon the configuration, ILA 100 is capable of storing only probed signals 135 in response to a trigger condition, only signals 185 in response to a trigger condition, or both probed signals 135 and signals 185 in response to a trigger condition.

In the example illustrated in FIG. 1A, CC circuit 115 includes a register 175. Register 175 is capable of storing a command that specifies a location in trace storage memory 120 where the trigger condition occurred, e.g., the location of the samples stored when match signal 145 indicates the detection of a trigger condition. Register 175 further is capable of storing a window mask that allows CC circuit 115 to utilize multiple windows. In particular embodiments, the CC circuit command stored in register 175 is a 3-bit value that indicates the location of the sample (hereafter the "trigger condition sample") within a given window of trace storage memory 120 that occurred at the time match signal 145 indicates the detection of a trigger condition. Register 175 can be written by processor 190, e.g., a host. The window mask specifies the size of each window to be implemented in trace storage memory 120 and, as such, the number of windows that are implemented in trace storage memory 120.

Table 2 illustrates example CC circuit commands that can be written by a host to register 175 to control operation of CC circuit 115.

TABLE 2

| CC Circuit Command | Trace Storage Memory Configuration |
| --- | --- |
| 3'h0 | Location of trigger condition sample is first sample in the trace data (0%). Window mask defines size of each window. |
| 3'h1 | Location of trigger condition sample is at 25% through the trace data. |
| 3'h2 | Location of trigger condition sample is at 50% through the trace data. |
| 3'h3 | Location of trigger condition sample is at 75% through the trace. |
| 3'h4 | Location of trigger condition sample is the last sample in the trace data (e.g., 100%). |
| 3'h5 | Every stored sample has a match = 1 (equivalent to n windows where n is the size of the trace storage memory). |

In the case of the CC circuit command "3'h0", a window mask can be specified. The window mask may be specified as one or more bits following the CC circuit command "3'h0". The window mask specifies the size of the window and is specified as a value that is a power of 2. If loaded with a value n (where n is a power of two), each window has a size of n+1. As an illustrative and non-limiting example, the CC circuit command may be specified as "3'h0" followed by a window mask of "10'h01F" (31 decimal) as stored in register 175. As such, the size of the window is 32 bits. In order to write to a window of 32 bits, 5 address bits are required. Higher order bits are used to specify the particular window being written as more than one window sized at 32 bits is able to fit within trace storage memory 120. In another example, a window size of 1024 samples requires an address width of 10 bits. Higher order bits are used to index into different windows. In particular embodiments, the window mask may only be used in the case where the trigger condition sample is stored at the 0% location in the trace data. As such, for the other CC circuit commands, the window mask is ignored.

CC circuit 115 is capable of outputting a done signal 180. Assertion of done signal 180, e.g., either pulling up or pulling down, indicates a memory full condition, e.g., that trace storage memory 120 is full and is unable to store any further trace data. CC circuit 115 is capable of providing done signal 180 to one or more other ILAs implemented within the same IC as ILA 100. For example, done signal 180 can be provided to the combine circuit of one or more other ILAs. The other ILAs that receive done signal 180 (and/or signal 165) are capable of incorporating such signals into the function applied by the combine circuit included therein to base the determination of whether a trigger condition is detected upon not only the indication signals of that ILA, but also any other done signal(s) and/or match signal(s) received from other ILA(s). Use of the done signal, for example, allows ILAs to be cascaded or daisy chained so that one downstream ILA is enabled only in response to an upstream ILA experiencing a memory full condition.

FIG. 1A is provided for purposes of illustration and not limitation. As noted, the circuit architecture of ILA 100 is compact, efficient, and able to operate at higher clock rates than other larger ILAs. The compact circuit architecture of ILA 100 allows more than one instance of ILA 100 to be included within a user circuit design. Each instance of ILA 100 may be configured independently of the others. Some ILAs, for example, may be similar or the same, while others may be different.

As an illustrative example, some ILAs may have the same or a different number of match cells. The ILAs may have different functions stored in register 150 and different CC circuit commands and/or window masks stored in register 175. Further, each ILA may be controlled dynamically during runtime (e.g., during operation of the ILA and the IC) by a host through bus interface 125. Through bus interface 125, the host is capable of writing to each of match cells 130 of each ILA, writing to register 150 of each ILA, and/or writing to register 175 of each ILA during operation of the respective ILA and the IC including the ILAs. As noted, each ILA is further capable of indicating, via bus interface 125, whether a trigger condition is detected. The host may also read or otherwise access each trace storage memory 120 via bus interface 125 to obtain the trace data stored therein.

By using a plurality of smaller ILAs instead of one larger ILA, the EDA tools have more flexibility when performing functions such as synthesis, placement, and routing. A signal, for example, need not be routed from one end of the IC to another to reach the single, monolithic ILA. Rather, a user may specify that two or more smaller ILAs be added to the circuit design. The EDA tool is capable of adding the ILAs to the user circuit design and locating the ILAs near the particular signal or signals that are to be probed. In this regard, the EDA tool, in performing a design flow (e.g., synthesis, placement, routing, and/or configuration bitstream generation) is capable of distributing the ILAs throughout the IC in close proximity to the particular signals to be probed. This allows the EDA tools to execute in a more computationally efficient manner, thereby reducing runtime of the EDA tools and also improving the operation of the IC.

As an illustrative and non-limiting example, in the case where a user desires to probe additional signals, the user need only add a further lightweight ILA as described herein into the user's circuit design to probe the additional signals. The existing ILAs included in the circuit design may be left intact and need not be re-implemented. A first ILA may be implemented to monitor a 20-bit wide probed signal of the user's circuit design. The ILA may be configured specifically to monitor the 20-bit signal (e.g., not able to monitor further signals). If the user wishes to monitor another 10-bit signal, the EDA tool is capable of inserting another 10-bit ILA to monitor the 10-bit signal. The 20-bit wide ILA may be implemented near the 20-bit signal being probed (e.g., already implemented near the 20-bit signal). The 10-bit ILA may be implemented near the 10-bit signal being probed. Operations such placement and routing, for example, require less runtime on the part of the EDA tools. Further, the efficiency of using an ILA specifically tailored to monitor a signal of a particular size means that resources of the IC are not wasted or utilized to implement a larger, monolithic ILA with more capacity than is required.

In the conventional case with a single, monolithic ILA, the ILA would need to be re-implemented from 20-bits wide to 30-bits wide and placed somewhere on the IC so as to be connected to both the signals, thereby making placement and routing less efficient (e.g., requiring more time and/or achieving a lower quality result). The single ILA circuit block must be completely re-implemented and potentially relocated to accommodate the new signals to be probed. Thus, in accordance with the inventive arrangements described herein, the EDA tool is able to incorporate the additional ILA in less time (e.g., using fewer computational resources) than in the case where only one, large ILA is included and must be reconfigured.

Another benefit of using multiple, smaller ILAs rather than one large ILA, is that fitting the ILAs on the IC with the user design is more likely. In many cases, the sheer size of the single, larger ILA is restrictive in that certain user designs do not fit on the IC with the ILA. By using one or more smaller ILAs, the ILAs can be distributed to locations where circuitry of the IC is not used by the user circuit design.

The inventive arrangements described herein also increase the likelihood that the user's circuit design including the ILA(s) will meet timing. As noted, the ILA circuit architecture described herein is capable of operating at higher clock speeds than a single, monolithic ILA. This means that the ILA(s), as described herein, are less likely to be the source of any timing critical paths in the user's circuit design. Further, since ILAs may be located closer to the signals that are probed, signal delays incurred to route probed signals to the ILAs are reduced.

In one or more embodiments, one or more of ILAs 100 may be pre-instantiated within a user circuit design with deferred post routing of signals to ILAs 100. For example, the system is capable of including one or more ILAs within a user circuit design. The system may include a preference that may be selected by a user to enable the functionality and to specify the size and/or number of ILAs 100 included in the user circuit design. As such, one or more ILAs 100 may be included in the user circuit design (e.g., synthesized and placed in the user circuit design).

Though ILAs 100 are included in the user circuit design through pre-instantiation, the user circuit design is routed, but signals of the user circuit design are not routed to ILAs 100 as probed signals 135 or as signals 185. By including one or more pre-instantiated ILAs 100 in a user circuit design and deferring the connection of signals of the user design to the ILAs 100 to a later time, time consuming and costly re-implementation of the user circuit design to introduce ILAs 100 therein can be avoided. Using pre-instantiation, when one or more ILAs 100 are needed, the system need only connect selected signals of the user circuit design to ILAs 100, which are already included therein. This connection process, e.g., routing of selected signals of the user circuit design to ILAs 100 as probed signals 135 and/or signals 185, saves time by reducing the runtime of the system required compared to first introducing ILAs 100 into the already implemented user circuit design thereby forcing re-implementation of the modified circuit design through the entire design flow (e.g., synthesis, placement, and routing).

Pre-instantiation of ILAs 100 is further beneficial in the sense that the particular signals to be debugged are not always known in the early stages of the design process. These signals may only be ascertained in the post-placed/routed circuit design. Moreover, in some cases, the re-implementation of a circuit design, which occurs when including ILAs 100 into the user circuit design (when pre-instantiation is not used) can lead to a particular bug (e.g., defect) in the circuit design migrating from one location to another. The targeted connection or re-connection of signals as described in the context of pre-instantiation avoids this phenomenon.

Figure 1B:
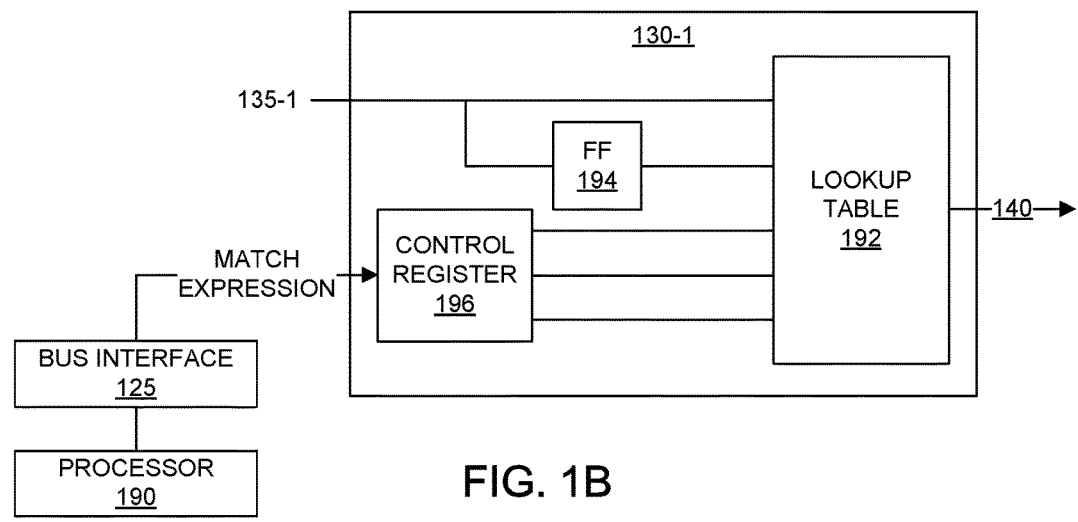
FIG. 1B illustrates an example implementation of a match cell.

FIG. 1B illustrates an example implementation of a match cell 130 of FIG. 1. In the example of FIG. 1B, match cell 130-1 is shown. Match cell 130-1 includes a lookup table 192, a flip-flop 194, and a control register 196. Lookup table 192 is implemented or configured to have 5 inputs. A first of the inputs is connected to probed signal 135-1. A second of the inputs is connected to a delayed version of probed signal 135-1 generated by, and provided from, flip-flop 194. The remaining three inputs of lookup table 192 are connected to control register 196. Control register 196, as described in connection with FIG. 1A, stores a match expression from Table 1 that defines the functionality provided by match cell 130-1. The match expression may be written to control register 196 by a host such as processor 190 via bus interface 125. In the example of FIG. 1B, control register 196 provides the 3 bits of the match expression to lookup table 192 as the third, fourth, and fifth inputs. Based upon the received inputs, lookup table 192 outputs an indication signal 140 as described and in accordance with the match expression loaded into control register 196.

The example of FIG. 1B is built around a standard lookup table circuit as opposed to using a vendor specific circuit or a specialty circuit (e.g., shift registers or specialized lookup tables such as the CFGLUT5 within some ICs available from Xilinx Inc. of San Jose, Calif.). As such, the match cell circuit structure may be ported to, and used in, a variety of different types of ICs (e.g., FPGAs or ASICS) available from any of a variety of different hardware vendors.

Figure 2A:
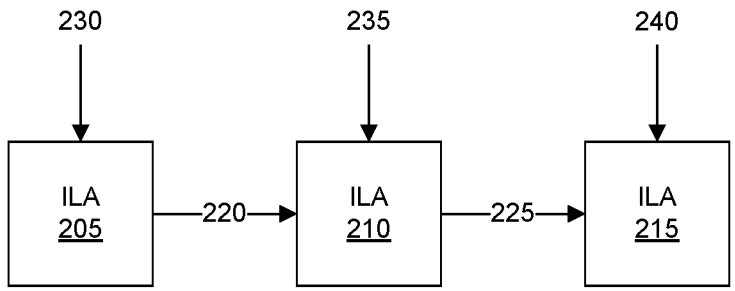
FIGS. 2A-2C illustrate example distributions of ILAs within an integrated circuit (IC).
Figure 2B:
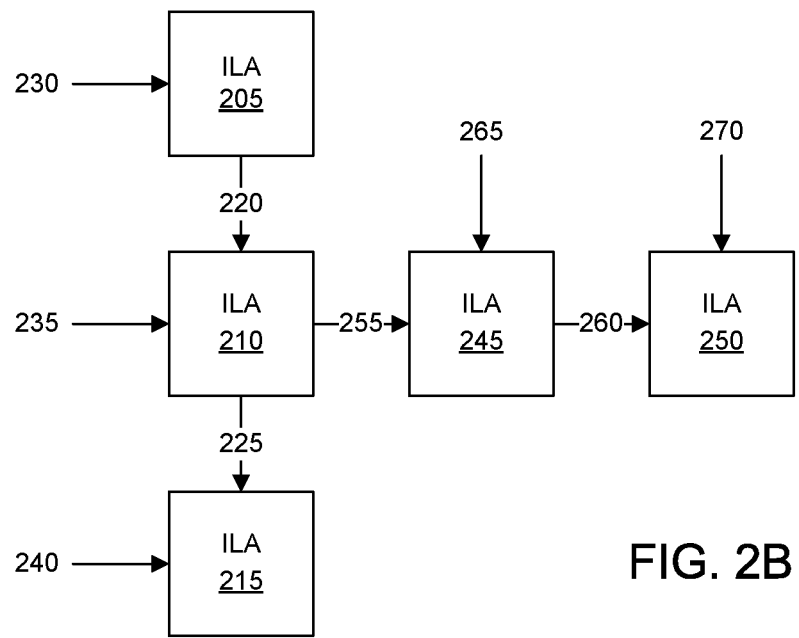
Figure 2C:
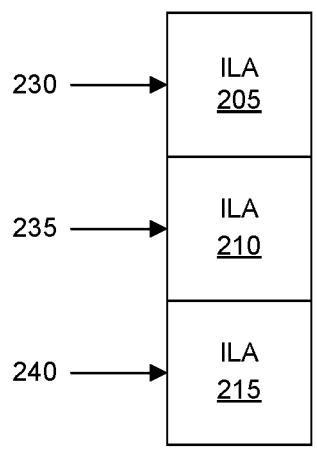

FIGS. 2A-2C illustrate example distributions of ILAs within an IC. FIG. 2A illustrates an example of cascaded ILAs. In the example of FIG. 2, ILAs 205, 210, and 215 are shown in a cascaded configuration. While FIG. 2A illustrates 3 cascaded ILAs, the number of ILAs that may be cascaded may be two or more than three. The particular number shown in FIG. 2A is for purposes of illustration only. Each of ILAs 205, 210, and 215 is implemented using the architecture described in connection with FIG. 1. As noted, however, ILAs 205, 210, and 215 may be implemented with similar or same configurations or with entirely different configurations. ILA 205 monitors probed signals 230. ILA 210 monitors probed signals 235. ILA 215 monitors probed signals 240. Each ILA 205, 210, and 215 monitors different probed signals of the user's circuit design.

In one or more other embodiments, two or more of ILAs 205, 210, and/or 215 may be implemented to monitor same probed signals to achieve a greater depth of trace data (e.g., store more trace data). Further, two or more of ILAs 205, 210, and/or 215 may be implemented to monitor the same signals in order to trigger upon a sequence of the signals. For example, ILA 205 is capable of looking for and triggering in response to detecting condition A, ILA 210 is capable of looking for and triggering in response to detecting condition B, and ILA 215 is capable of looking for and triggering in response to detecting condition C. In one or more embodiments, the last of the plurality of ILAs, e.g., ILA 215 may include trace memory while ILAs 205 and 210 do not have trace memory. As such, ILA 215 effectively triggers and stores data in response to detecting condition A, then condition B, and then condition C.

FIG. 2A illustrates an example where ILA 210 detects a trigger condition based, in part, upon an operating state detected in ILA 205. In one or more embodiments, ILA 205 provides signal 220 to ILA 210. In the example of FIG. 2A, ILA 210 utilizes signal 220 to determine whether a trigger condition is detected. For example, ILA 210 may utilize a function as specified by register 150 in the combine circuit included in ILA 210 that uses signal 220 as an input to determine whether a trigger condition is detected therein. The function may also utilize one or more or all of the indicator signals generated within ILA 210 from analysis of probed signals 235 in determining whether to enable (e.g., whether a trigger condition is detected).

Similarly, ILA 215 is capable of detecting a trigger condition based, in part, upon an operating state detected in ILA 210. In one or more embodiments, ILA 210 provides signal 225 to ILA 215. In the example of FIG. 2A, ILA 215 utilizes signal 225 to determine whether a trigger condition is detected. For example, ILA 215 may utilize a function as specified by register 150 in the combine circuit included in ILA 215 that uses signal 225 as an input to determine whether a trigger condition is detected therein. The function may also utilize one or more or all of the indicator signals generated within ILA 215 from analysis of probed signals 240 in determining whether to enable.

In one or more embodiments, the operating state detected in ILA 205 and in ILA 210 is a memory full condition. For example, signal 220 may be a done signal generated by ILA 205; and, signal 225 may be a done signal generated by ILA 210. In one or more other embodiments, the operating state detected in ILA 205 and in ILA 210 is the occurrence or detection of a trigger condition. For example, signal 220 may be match signal generated by ILA 205; and, signal 225 may be a match signal generated by ILA 210.

In one or more embodiments, the operating state detected in ILA 205 is a memory full condition, while the operating state detected in ILA 210 is the occurrence or detection of a trigger condition. For example, signal 220 may be a done signal generated by ILA 205; and, signal 225 may be a match signal generated by ILA 210. In one or more other embodiments, the operating state detected in ILA 205 is the occurrence or detection of a trigger condition; and, the operating state detected in ILA 210 is a memory full condition. For example, signal 220 may be a match signal generated by ILA 205; and, signal 225 may be a done signal generated by ILA 210.

FIG. 2B illustrates another example of ILAs distributed in an IC. In the example of FIG. 2B, ILAs 205, 210, and 215 may be implemented as described in connection with FIG. 2A. ILA 245 and ILA 250 are added. ILA 245 monitors probed signals 265. ILA 250 monitors probed signals 270.

FIG. 2B illustrates an example where ILA 245 is capable of detecting a trigger condition, based, in part, upon an operating state detected in ILA 210. In one or more embodiments, ILA 210 provides signal 255 to ILA 245. In the example of FIG. 2B, ILA 245 utilizes signal 255 to determine whether a trigger condition is detected. For example, ILA 245 is capable of using a function as specified by register 150 in the combine circuit included in ILA 245 that uses signal 255 as an input. The function may also utilize one or more or all of the indicator signals generated within ILA 245 from analysis of probed signals 265 in determining whether a trigger condition is detected.

Similarly, ILA 250 is capable of detecting a trigger condition based, in part, upon an operating state detected in ILA 245. In one or more embodiments, ILA 245 provides signal 260 to ILA 250. In the example of FIG. 2B, ILA 250 utilizes signal 260 to determine whether a trigger condition is detected. For example, ILA 250 may utilize a function as specified by register 150 in the combine circuit included in ILA 250 that uses signal 260 as an input. The function may also utilize one or more or all of the indicator signals generated within ILA 250 from analysis of probed signals 270 in determining whether a trigger condition is detected.

In one or more embodiments, signals 255 and 260 are match signals. In one or more other embodiments, signals 255 and 260 are done signals. In one or more other embodiments, signal 255 is a match signal, while signal 260 is a done signal. In one or more other embodiments, signal 255 is a done signal, while signal 260 is a match signal.

FIG. 2C illustrates another example of ILAs distributed in an IC. In the example of FIG. 2C, ILAs 205, 210, and 215 are stacked. In the example of FIG. 2C, ILAs 205, 210, and 215 are capable of operating completely independently of one another. For example, ILA 205 is not coupled to ILA 210 by either a done signal or a match signal. Similarly, ILA 210 is not coupled to ILA 210 by either a done signal or a match signal. In the stacked configuration, ILAs 205, 210, and 215 may be used to achieve a wider bit width or to monitor 3 different probed signals (e.g., probed signals 230, 235, and 240).

Figure 3:
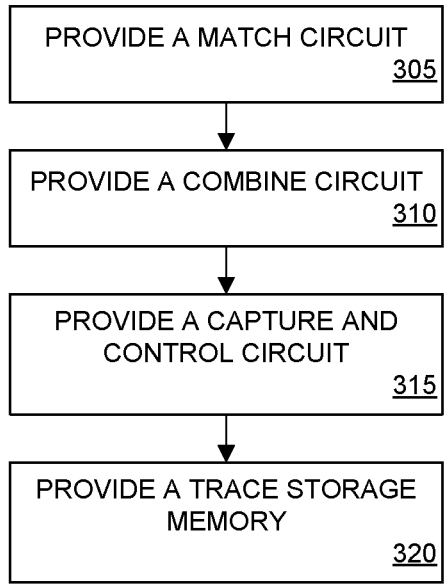
FIG. 3 illustrates an example method of providing an ILA within an IC.

FIG. 3 illustrates an example method 300 of providing an ILA within an IC or other electronic system. The ILA can have an architecture the same as or similar to ILA 100 described in connection with FIG. 1.

Method 300 can begin in block 305, where a match circuit is provided within the IC. In one or more embodiments, the match circuit includes one or more match cells. Each of the match cells is capable of being configured, e.g., programmed, at runtime to detect a signal state, e.g., a selected signal state, from a plurality of different signal states for a probed signal. Each match cell is capable of outputting an indication signal specifying whether the selected signal state is detected on the probed signal monitored or evaluated by the match cell.

In block 310, a combine circuit is provided within the IC. The combine circuit is coupled to the match circuit. The combine circuit is capable of generating a match signal, e.g., a first match signal, indicating an occurrence of a first trigger condition based upon the detected signal state of each match cell. The signal state detected by each match cell is specified by the indication signal output from the match cell and provided to the combine circuit.

In particular embodiments, where a plurality of match cells are included in the match circuit, one or more of the match cells can be set to a don't care state so that the states of such match cells are not taken into consideration when determining whether a trigger condition is detected.

In one or more embodiments, the combine circuit is capable of receiving one or more additional match signals from one or more different ILAs implemented within the IC. For example, the combine circuit is capable of receiving a second match signal from a different ILA in the IC. The second match signal indicates an occurrence of a trigger condition (e.g., a second trigger condition) detected in the different ILA. In that case, the first match signal can be generated based upon the detected state of each match cell and/or the second match signal.

In particular embodiments, the combine circuit is capable of outputting the first match signal, or a copy thereof, to one or more different ILAs in the IC. As discussed, the current state of the match signal may also be output from the combine circuit, or exposed, to a bus interface where a host is capable of reading the state of the match signal.

In particular embodiments, the combine circuit is configured to receive a done signal indicating a memory full condition from one or more different ILAs in the IC. The combine circuit is capable of generating the first match signal based upon the state of each match cell and/or the done signal received from the different ILA(s).

In particular embodiments, the combine circuit includes a register that stores data specifying the function that is performed using the detected signal state of one or more or any combination of match cell(s), any match signal(s) received from other ILA(s), and/or any done signal(s) received from other ILA(s).

In block 315, a CC circuit is provided. The CC circuit is capable of determining addressing for storing trace data for the probed signal(s). In one or more embodiments, the CC circuit includes a register capable of specifying a location within the trace storage memory for trace data corresponding to the trigger condition. For example, the location indicates where value(s) or samples of the probed signal(s) stored at the time that the trigger condition is detected are stored within one or more windows of the trace storage memory.

In particular embodiments, the CC circuit is capable of generating a done signal indicating a memory full condition. The done signal generated by the CC circuit can be provided to one or more other (e.g., different) ILAs in the IC.

In block 320, a trace storage memory is provided. The trace memory is configured to store trace data for the probed signal(s) under control of the CC circuit. For example, the trace storage memory is capable of storing received trace data in response to being write enabled by the CC circuit and storing the trace data at the addresses provided by the CC circuit.

The various circuit blocks described, e.g., the match circuit, the combine circuit, and the capture circuit each can be programmed or configured at runtime by a host.

Figure 4:
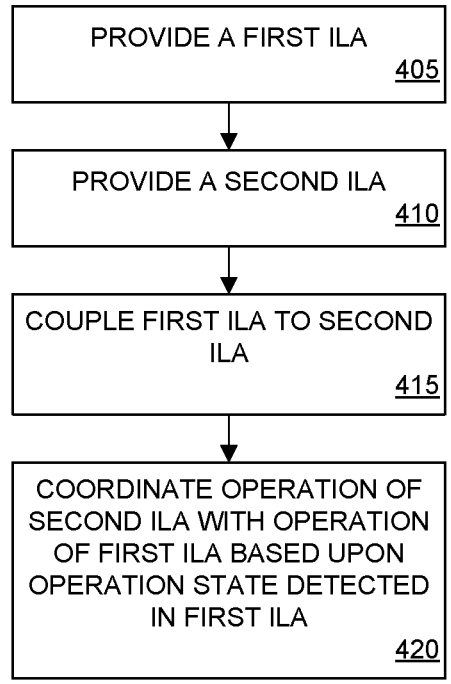
FIG. 4 illustrates an example method of implementing a plurality of ILAs within an IC.

FIG. 4 illustrates an example method 400 of implementing a plurality of ILAs within an IC. In block 405, a first ILA is provided. The first ILA has a circuit architecture the same as or similar to ILA 100 described in connection with FIG. 1. In block 410, a second ILA is provided. The second ILA has an architecture the same as or similar to ILA 100 described in connection with FIG. 1.

In block 415, the first ILA is coupled to the second ILA. For example, the match signal generated by the first ILA and/or the done signal generated by the first ILA is coupled to the second ILA. More particularly, either one or both of the signals can be coupled to the combine circuit of the second ILA.

In block 420, the operation of the second ILA is coordinated with operation of the first ILA based upon a detected operating state in the first ILA. For example, the combine circuit of the second ILA may incorporate the match signal and/or the done signal received from the first ILA into the determination of whether a trigger condition is detected. As such, enablement of the second ILA is predicated upon the operating state of the first ILA as indicated by the particular signal(s) received from the first ILA.

Figure 5:
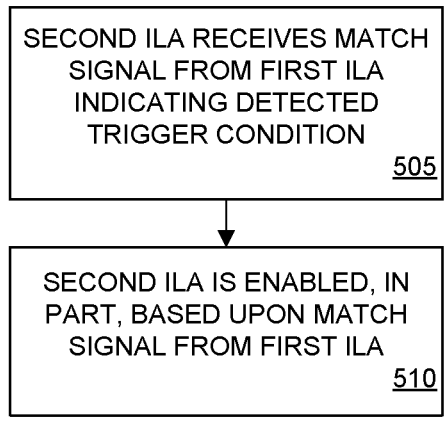
FIG. 5 illustrates an example of coordinating operation of one or more ILAs based upon the operating state of another ILA.

FIG. 5 illustrates an example of coordinating operation of one or more ILAs based upon the operating state of another ILA. Method 500 of FIG. 5, for example, provides an example implementation of block 420 of FIG. 4.

In block 505, the second ILA receives a match signal from the first ILA indicating that a trigger condition has been detected in the first ILA. For purposes of discussion, circuit blocks in each respective ILA are referred to using either "first" or "second". For example, the match cells in the second ILA are referred to as "second match cells". Similarly, the combine circuit in the second ILA is referred to as the "second combine circuit".

In block 510, the second ILA is enabled, in part, based upon the match signal received from the first ILA. The second ILA is capable of using the received match signal from the first ILA in determining whether a trigger condition is detected in the second ILA. The second combine circuit, for example, is capable of applying the function specified by the register included therein to the indicator signals generated by the second match cell(s) and the match signal received from the first ILA. Thus, the second ILA is capable of determining whether a trigger condition has been detected therein based, at least in part, upon, and responsive to, the match signal received from the first ILA.

Figure 6:
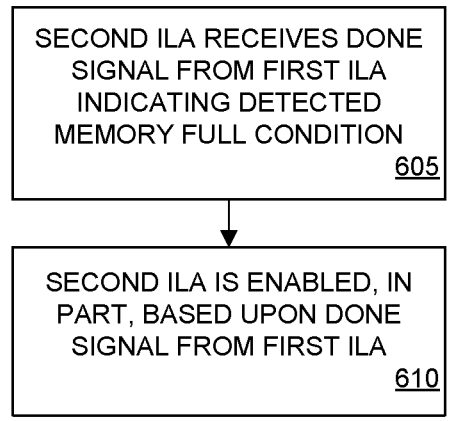
FIG. 6 illustrates another example of coordinating operation of one or more ILAs based upon the operating state of another ILA.

FIG. 6 illustrates another example of coordinating operation of one or more ILAs based upon the operating state of another ILA. Method 600 of FIG. 6, for example, provides another example implementation of block 420 of FIG. 4.

In block 605, the second ILA receives a done signal from the first ILA indicating that a memory full condition has been detected in the first ILA. In block 610, the second ILA is enabled, in part, based upon the done signal received from the first ILA. The second ILA is capable of using the received match signal from the first ILA in determining whether a trigger condition is detected in the second ILA. The second combine circuit, for example, is capable of applying the function specified by the register included therein to the indicator signals generated by the second match cell(s) and the done signal received from the first ILA. Thus, the second ILA is capable of determining whether a trigger condition has been detected therein based, at least in part, upon, and responsive to, the done signal received from the first ILA.

In the examples described, a first ILA and a second ILA are used for purposes of illustration. In other embodiments, a given ILA may receive a done signal and/or a match signal from more than one other ILA and base the determination of whether a trigger condition is detected therein upon the operating state in such other ILAs as indicated by the signals received from such other ILAs.

Figure 7:
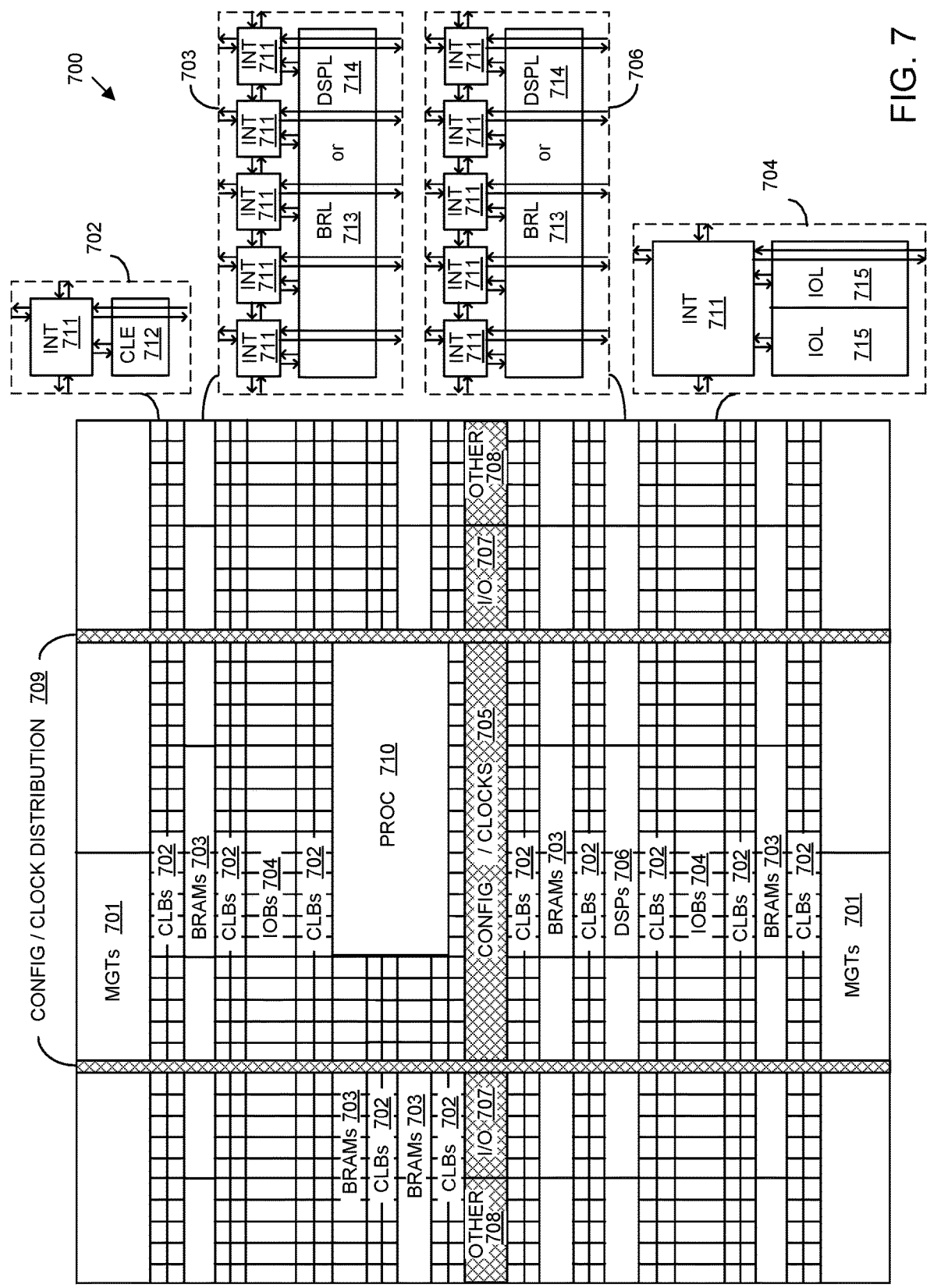
FIG. 7 illustrates an example architecture for an IC for use with one or more of the embodiments described herein.

FIG. 7 illustrates an example architecture 700 for an IC. Architecture 700 can be used to implement an IC in which a user circuit design is implemented in combination with one or more of the ILAs as described herein in connection with FIG. 1. In one aspect, architecture 700 may be implemented within a programmable IC. For example, architecture 700 may be used to implement an FPGA. Architecture 700 may also be representative of a system-on-chip (SOC) type of IC. An SOC is an IC that includes a processor that executes program code and one or more other circuits. The other circuits may be implemented as hardwired circuitry, programmable circuitry, and/or a combination thereof. The circuits may operate cooperatively with one another and/or with the processor.

In particular embodiments, the ILAs may be implemented in an integrated manner with the user circuit design using programmable circuitry of the IC. In one or more embodiments, the ILA is implemented using one or more configurable logic blocks and the lookup tables included therein and/or other circuit blocks as described herein in connection with architecture 700. For example, one or more block random access memory blocks can be used to implement trace storage memory 120.

In one or more other embodiments, the ILA circuit architecture described herein may be synthesized and implemented as a hardened, e.g., a hardwired, circuit block within an IC using architecture 700 or an architecture similar thereto. In one or more other embodiments, the ILA circuit may be implemented as a hardened circuit block within an application specific IC (ASIC). In particular embodiments, while certain aspects of the ILA may be hardened, e.g., the number of match cells, the various circuit blocks still may be programmed at runtime. For example, registers of match cells, the register of the combine circuit, and the register of the CC circuit can be programmed by a host at runtime. The examples provided herein relating to implementation in programmable circuitry are for purposes of illustration and are not intended as limitations.

As shown, architecture 700 includes several different types of programmable circuit, e.g., logic, blocks. For example, architecture 700 may include a large number of different programmable tiles including multi-gigabit transceivers (MGTs) 701, configurable logic blocks (CLBs) 702, random access memory blocks (BRAMs) 703, input/output blocks (IOBs) 704, configuration and clocking logic (CONFIG/CLOCKS) 705, digital signal processing blocks (DSPs) 706, specialized I/O blocks 707 (e.g., configuration ports and clock ports), and other programmable logic 708 such as digital clock managers, analog-to-digital converters, system monitoring logic, and so forth.

In some ICs, each programmable tile includes a programmable interconnect element (INT) 711 having standardized connections to and from a corresponding INT 711 in each adjacent tile. Therefore, INTs 711, taken together, implement the programmable interconnect structure for the illustrated IC. Each INT 711 also includes the connections to and from the programmable logic element within the same tile, as shown by the examples included at the top of FIG. 7.

For example, a CLB 702 may include a configurable logic element (CLE) 712 that may be programmed to implement user logic plus a single INT 711. A BRAM 703 may include a BRAM logic element (BRL) 713 in addition to one or more INTs 711. Typically, the number of INTs 711 included in a tile depends on the height of the tile. As pictured, a BRAM tile has the same height as five CLBs, but other numbers (e.g., four) also may be used. A DSP tile 706 may include a DSP logic element (DSPL) 714 in addition to an appropriate number of INTs 711. An 10B 704 may include, for example, two instances of an I/O logic element (IOL) 715 in addition to one instance of an INT 711. The actual I/O pads connected to IOL 715 may not be confined to the area of IOL 715.

In the example pictured in FIG. 7, a columnar area near the center of the die, e.g., formed of regions 705, 707, and 708, may be used for configuration, clock, and other control logic. Horizontal areas 709 extending from this column may be used to distribute the clocks and configuration signals across the breadth of the programmable IC.

Some ICs utilizing the architecture illustrated in FIG. 7 include additional logic blocks that disrupt the regular columnar structure making up a large part of the IC. The additional logic blocks may be programmable blocks and/or dedicated circuitry. For example, a processor block depicted as PROC 710 spans several columns of CLBs and BRAMs.

In one aspect, PROC 710 may be implemented as dedicated circuitry, e.g., as a hardwired processor, that is fabricated as part of the die that implements the programmable circuitry of the IC. PROC 710 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 710 may be omitted from architecture 700 (e.g., as a hardwired circuit) and replaced with one or more of the other varieties of the programmable blocks described. Further, such blocks may be utilized to form a "soft processor" in that the various blocks of programmable circuitry may be used to form a processor that can execute program code as is the case with PROC 710.

In particular embodiments, PROC 710, whether implemented as a hardwired processor or a soft processor, is capable of operating as a host as described herein. For example, PROC 710 can be used to implement processor 190 of and is capable of coupling to bus interface 125 of FIG. 1 to function as a host to communicate, configure, and/or program the various circuit blocks described within ILA 100.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 7 that are external to PROC 710 such as CLBs 702 and BRAMs 703 are considered programmable circuitry of the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 710.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

In the case of an SOC, the configuration bitstream may specify the circuitry that is to be implemented within the programmable circuitry and the program code that is to be executed by PROC 710 or a soft processor. In some cases, architecture 700 includes a dedicated configuration processor that loads the configuration bitstream to the appropriate configuration memory and/or processor memory. The dedicated configuration processor does not execute user-specified program code. In other cases, architecture 700 may utilize PROC 710 to receive the configuration bitstream, load the configuration bitstream into appropriate configuration memory, and/or extract program code for execution.

FIG. 7 is intended to illustrate an example architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 7 are purely illustrative. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 710 within the IC are for purposes of illustration only and are not intended as limitations.

Figure 8:
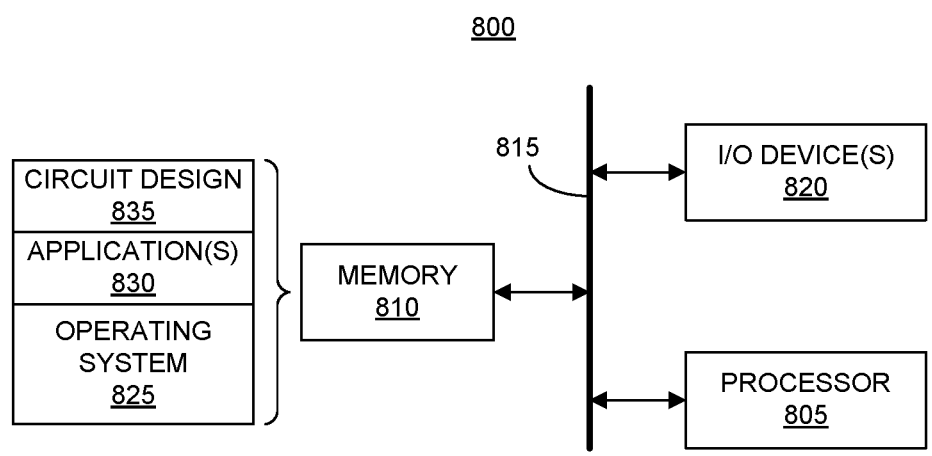
FIG. 8 illustrates an example data processing system for use with one or more of the embodiments described herein.

FIG. 8 illustrates an example of a data processing system (system) 800 for use with one or more embodiments described herein. In an aspect, system 800 is implemented as a computer or other system or device (e.g., laptop computer, server, desktop computer, tablet computer, or other suitable computing device) that is suitable for storing and/or executing program code.

System 800 includes at least one processor 805. Processor 805 is coupled to memory 810 through interface circuitry 815. System 800 stores computer readable instructions (also referred to as "program code") within memory 810. Memory 810 is an example of computer readable storage media. Processor 805 executes the program code accessed from memory 810 via interface circuitry 815.

Memory 810 includes one or more physical memory devices such as, for example, a local memory and one or more bulk storage devices. The term "local memory" refers to non-persistent memory device(s) generally used during actual execution of the program code. Examples of local memory include random access memory (RAM) and/or any of the various types of RAM that are suitable for use by a processor during execution of program code. The term "bulk storage device" refers to persistent data storage devices. Examples of a bulk storage device include a hard disk drive (HDD), flash memory, and a solid-state drive (SSD). System 800 may also include one or more cache memories (not shown) that provide temporary storage of at least some program code in order to reduce the number of times program code must be retrieved from a bulk storage device during execution.

Examples of interface circuitry 815 include, but are not limited to, an input/output (I/O) subsystem, an I/O interface, a bus system, and a memory interface. For example, interface circuitry 815 may be one or more of any of several types of bus structures, including a memory bus or memory controller, a peripheral bus, an accelerated graphics port, and a processor or local bus using any of a variety of bus architectures. By way of example, and not limitation, such bus architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

System 800 further may include one or more input/output (I/O) devices 820 coupled to interface circuitry 815. I/O devices 820 may be coupled to system 800, e.g., interface circuitry 815, either directly or through intervening I/O controllers. Examples of I/O devices 820 include, but are not limited to, a keyboard, a display device, a pointing device, one or more communication ports, a network adapter, etc. A network adapter refers to circuitry that enables system 800 to become coupled to other systems, computer systems, remote printers, and/or remote storage devices through intervening private or public networks. Modems, cable modems, Ethernet cards, and wireless transceivers are examples of different types of network adapters that may be used with system 800.

Memory 810 stores one or more program modules. The program modules may generally include routines, programs, objects, components, logic, data structures, and so on. For purposes of illustration, memory 810 stores an operating system 825, one or more application(s) 830, and a circuit design 835 and/or other data. Circuit design 835 may be specified using a hardware description language, as a netlist, or in another suitable format. In one or more embodiments, application(s) 830 include an EDA application. The EDA application is capable of performing a design flow including synthesis, placement, routing, and/or configuration bitstream generation on circuit design 835.

In an aspect, operating system 825 and application(s) 830, being implemented in the form of executable program code, are executed by system 800 and, more particularly, by processor 805, to perform one or more of the operations described within this disclosure. As such, operating system 825 and application(s) 830 may be considered an integrated part of system 800. Further, it should be appreciated that any data used, generated, and/or operated upon by system 800 (e.g., processor 805) are functional data structures that impart functionality when employed as part of the system.

Using the EDA application, for example, a user is capable of specifying which signals of circuit design 835 (e.g., a user circuit design) are to be probed, the number of ILAs to be included into circuit design 835, and the configuration of such ILAs. For example, the user may provide one or more user inputs specifying such data through a user interface provided by the EDA application. In performing the design flow, e.g., synthesis, placement, routing, and/or configuration bitstream generation, the EDA application includes or inserts the one or more ILA cores within the user circuit design as described herein in connection with FIG. 1 to monitor the probed signals of circuit design 835 and generate trace data from debug signals as described.

Once the user circuitry and the ILA(s) are physically implemented in a target IC, e.g., an IC having an architecture the same as or similar to that of FIG. 7 by loading the configuration bitstream therein, the ILA(s) can be configured or reconfigured using a host (e.g., system 800 coupled to an IC or an embedded processor within the IC). The host, for example, is capable of writing to one or more (e.g., any combination) or all of match cell(s) 130, writing to register 150 of combine circuit 110, and/or writing to register 175 of CC circuit 115. The host further is capable of reading from trace storage memory 120 and reading the status of match signal 145. The host is capable of communicating with each ILA implemented in the target IC as described through a respective one of the bus interfaces. The bus interfaces, for example, can be coupled to an I/O interface and I/O pins, which are coupled to the host.

System 800 may include fewer components than shown or additional components not illustrated in FIG. 8 depending upon the particular type of device and/or system that is implemented. In addition, the particular operating system and/or application(s) included may vary according to device and/or system type as may the types of I/O devices included. Further, one or more of the illustrative components may be incorporated into, or otherwise form a portion of, another component. For example, a processor may include at least some memory.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without user intervention. As defined herein, the term "user" means a human being.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the terms "one embodiment," "an embodiment," "one or more embodiments," "particular embodiments," or similar language mean that a particular feature, structure, or characteristic described in connection with the embodiment is included in at least one embodiment described within this disclosure. Thus, appearances of the phrases "in one embodiment," "in an embodiment," "in one or more embodiments," "in particular embodiments," and similar language throughout this disclosure may, but do not necessarily, all refer to the same embodiment. The terms "embodiment" and "arrangement" are used interchangeably within this disclosure.

As defined herein, the term "processor" means at least one hardware circuit. The hardware circuit may be configured to carry out instructions contained in program code. The hardware circuit may be an integrated circuit. Examples of a processor include, but are not limited to, a central processing unit (CPU), an array processor, a vector processor, a digital signal processor (DSP), an FPGA, a programmable logic array (PLA), an ASIC, programmable logic circuitry, and a controller.

As defined herein, the term "output" means storing in physical memory elements, e.g., devices, writing to display or other peripheral output device, sending or transmitting to another system, exporting, or the like.

As defined herein, the term "real time" means a level of processing responsiveness that a user or system senses as sufficiently immediate for a particular process or determination to be made, or that enables the processor to keep up with some external process.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object-oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

One or more embodiments are directed to an IC that includes an ILA (e.g., a first ILA). In an aspect, the ILA includes a match circuit having at least one match cell, wherein each match cell is programmable at runtime to detect a signal state from a plurality of signal states for a probed signal, and a combine circuit configured to generate a first match signal indicating an occurrence of a first trigger condition based upon the detected signal state of each match cell. The ILA further can include a CC circuit configured to determine addressing for storing trace data corresponding to the probed signal and a trace storage memory configured to store the trace at addresses determined by the capture and control circuit.

In an aspect, the CC circuit includes a register configured to specify a location within the trace storage memory for trace data corresponding to the first trigger condition.

In another aspect, the CC circuit is configured to generate a done signal indicating a memory full condition that is provided to a second ILA in the IC.

In another aspect, the combine circuit is configured to receive a second match signal from a second ILA in the IC, wherein the second match signal indicates an occurrence of a second trigger condition detected in the second ILA, and wherein the first match signal is further generated based upon the second match signal.

In another aspect, the combine circuit is configured to output the first match signal to a second ILA in the IC.

In another aspect, the combine circuit is configured to receive a done signal indicating a memory full condition from a second ILA in the IC, wherein the first match signal is further generated based upon the done signal.

In another aspect, the combine circuit includes a register storing data specifying a function used to generate the first match signal.

In another aspect, the match circuit, the combine circuit, and the CC circuit each is programmable at runtime.

One or more embodiments are directed methods for implementing an ILA (e.g., a first ILA) within an IC. In an aspect, the method includes providing a match circuit including at least one match cell, wherein each match cell is programmable at runtime to detect a signal state from a plurality of signal states for a probed signal, and providing a combine circuit configured to generate a first match signal indicating an occurrence of a first trigger condition based upon the detected signal state of each match cell. The method can include providing a CC circuit configured to determine addressing for storing trace data corresponding to the probed signal and providing a trace storage memory configured to store the trace data at addresses determined by the capture and control circuit.

In an aspect, the method can include providing a register within the CC circuit, wherein the register is configured to specify a location with the trace storage memory for trace data corresponding to the first trigger condition.

In another aspect, the CC circuit is configured to generate a done signal indicating a memory full condition that is provided to a second ILA in the IC.

In another aspect, the combine circuit is configured to receive a second match signal from a second ILA in the IC, wherein the second match signal indicates an occurrence of a second trigger condition detected in the second ILA, and wherein the first match signal is further generated based upon the second match signal.

In another aspect, the combine circuit is configured to output the first match signal to a second ILA in the IC.

In another aspect, the combine circuit is configured to receive a done signal indicating a memory full condition from a second ILA in the IC, wherein the first match signal is further generated based upon the done signal.

In another aspect, the method includes providing a register within the combine circuit, wherein the register is configured to store data specifying a function used to generate the first match signal.

One or more embodiments are directed methods for probing signals within an IC. In an aspect, the method includes providing a first ILA and a second ILA within an IC and coupling the first ILA to the second ILA. The method can include coordinating operation of the second ILA with the first ILA based upon an operating condition detected within the first ILA.

In an aspect, the operating condition is a memory full condition.

In another aspect, the second ILA detects a trigger condition in response to the memory full condition and at a detected signal state of at least one probed signal monitored by the second ILA.

In another aspect, the operating condition is detecting a trigger condition.

In another aspect, the second ILA detects a trigger condition in response to the detected trigger condition in the first ILA and at a detected signal state of at least one probed signal monitored by the second ILA.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. An integrated circuit, comprising:
   a first integrated logic analyzer including:
   a match circuit including at least one match cell, wherein each match cell is programmable at runtime to detect a signal state from a plurality of signal states for a probed signal;
   a combine circuit configured to generate a match signal indicating an occurrence of a first trigger condition based upon the detected signal state of each match cell;
   a capture and control circuit configured to determine addressing for storing trace data corresponding to the probed signal;
   a trace storage memory configured to store the trace data at addresses determined by the capture and control circuit;
   wherein the first integrated logic analyzer indicates at least one of a memory full condition or the occurrence of the first trigger condition to a second integrated logic analyzer; and
   wherein the combine circuit is configured to output the match signal to the second integrated logic analyzer in the integrated circuit.

2. The integrated circuit of claim 1, wherein the capture and control circuit comprises a register configured to specify a number of a plurality of windows of trace data implemented in the trace storage memory, wherein each window corresponds to a different trigger condition.

3. The integrated circuit of claim 1, wherein the capture and control circuit is configured to generate a done signal indicating the memory full condition that is provided to the second integrated logic analyzer in the integrated circuit.

4. The integrated circuit of claim 1, wherein the second integrated logic analyzer includes a combine circuit configured to receive the match signal from the first integrated logic analyzer in the integrated circuit, wherein the second integrated logic analyzer determines an occurrence of a second trigger condition based, at least in part, on the match signal.

5. The integrated circuit of claim 1, wherein the second integrated logic analyzer includes a combine circuit configured to receive a done signal indicating the memory full condition from the first integrated logic analyzer in the integrated circuit, wherein the second integrated logic analyzer determines an occurrence of a second trigger condition based, at least in part, on the done signal.

6. The integrated circuit of claim 1, wherein the combine circuit includes a register storing data specifying a function used to generate the match signal.

7. The integrated circuit of claim 1, wherein the combine circuit and the capture and control circuit each is programmable at runtime.

8. A method for implementing a first integrated logic analyzer in an integrated circuit, the method comprising:
   providing a match circuit including at least one match cell, wherein each match cell is programmable at runtime to detect a signal state from a plurality of signal states for a probed signal;
   providing a combine circuit configured to generate a match signal indicating an occurrence of a first trigger condition based upon the detected signal state of each match cell;
   providing a capture and control circuit configured to determine addressing for storing trace data corresponding to the probed signal;
   providing a trace storage memory configured to store the trace data at addresses determined by the capture and control circuit;
   wherein the first integrated logic analyzer indicates at least one of a memory full condition or the occurrence of the first trigger condition to a second integrated logic analyzer; and
   wherein the combine circuit is configured to output the match signal to the second integrated logic analyzer in the integrated circuit.

9. The method of claim 8, further comprising:
   providing a register within the capture and control circuit, wherein the register is configured to specify a number of a plurality of windows of trace data implemented in the trace storage memory, wherein each window corresponds to a different trigger condition.

10. The method of claim 8, wherein the capture and control circuit is configured to generate a done signal indicating the memory full condition that is provided to the second integrated logic analyzer in the integrated circuit.

11. The method of claim 8, wherein the second integrated logic analyzer includes a combine circuit configured to receive the match signal from the first integrated logic analyzer in the integrated circuit, wherein the second integrated logic analyzer determines an occurrence of a second trigger condition based, at least in part, on the match signal.

12. The method of claim 8, wherein the second integrated logic analyzer includes a combine circuit configured to receive a done signal indicating the memory full condition from the first integrated logic analyzer in the integrated circuit, wherein the second integrated logic analyzer determines an occurrence of a second trigger condition based, at least in part, on the done signal.

13. The method of claim 8, further comprising:
providing a register within the combine circuit, wherein the register is configured to store data specifying a function used to generate the match signal.

14. A method of probing signals, the method comprising:
providing a first integrated logic analyzer and a second integrated logic analyzer within an integrated circuit;
coupling the first integrated logic analyzer to the second integrated logic analyzer;
coordinating operation of the second integrated logic analyzer with the first integrated logic analyzer based upon an operating condition detected within the first integrated logic analyzer;
wherein the operating condition includes the first integrated logic analyzer indicating at least one of a memory full condition or an occurrence of a first trigger condition to the second integrated logic analyzer; and
defining, based on a register in the first integrated logic analyzer, a number of a plurality of windows of trace data implemented in a trace storage memory of the first integrated logic analyzer, wherein each window corresponds to a different trigger condition.

15. The method of claim 14, wherein the second integrated logic analyzer detects a trigger condition in response to the memory full condition and at a detected signal state of at least one probed signal monitored by the second integrated logic analyzer.

16. The method of claim 14, further comprising:
programming the first integrated logic analyzer and the second integrated logic analyzer at runtime.

17. The method of claim 16, wherein the second integrated logic analyzer detects a trigger condition in response to the detected trigger condition in the first integrated logic analyzer and at a detected signal state of at least one probed signal monitored by the second integrated logic analyzer.

* * * * *